United States Patent
Chen et al.

(10) Patent No.: US 6,479,870 B1
(45) Date of Patent: Nov. 12, 2002

(54) ESD DEVICE WITH SALICIDE LAYER ISOLATED BY SHALLOW TRENCH ISOLATION FOR SAVING ONE SALICIDE BLOCK PHOTOMASK

(75) Inventors: Shiao-Shien Chen, Chung-Li; Tien-Hao Tang, Taipei Hsien; Shiang Huang-Lu, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/739,032

(22) Filed: Nov. 21, 2000

(30) Foreign Application Priority Data

Nov. 9, 2000 (TW) .......................................... 89123687 A

(51) Int. Cl.⁷ ............................................. H01L 23/62
(52) U.S. Cl. ........................ 257/355; 257/356; 257/357; 257/358; 257/359; 257/360; 257/361; 257/362; 257/363
(58) Field of Search ................................ 257/355, 356, 257/357, 358, 359, 360, 361, 362, 363

(56) References Cited

U.S. PATENT DOCUMENTS

| | | | | |
|---|---|---|---|---|
| 6,034,388 A | * | 3/2000 | Brown et al. | 257/296 |
| 6,114,226 A | * | 9/2000 | Chang et al. | 438/510 |
| 6,211,001 B1 | * | 4/2001 | Hsu | 438/220 |
| 6,310,380 B1 | * | 10/2001 | Cai et al. | 257/355 |

* cited by examiner

*Primary Examiner*—Richard Elms
*Assistant Examiner*—Douglas M Menz
(74) *Attorney, Agent, or Firm*—J.C. Patents

(57) ABSTRACT

A electrostatic discharge (ESD) device with salicide layers isolated by a shallow trench isolation in order to save one salicide block photomask. A shallow trench isolation is formed in drain region to isolate a portion of the drain region, so that the drain region is partitioned into two parts. A salicide layer is formed on the drain region. Since the salicide layer is not formed on the shallow trench isolation, without using an additional photomask, the salicide layer on the drain region is partitioned into two parts. The effect of the local thermal energy occurring to drain junction upon the contact metal of the drain region is eliminated.

5 Claims, 2 Drawing Sheets

ESD DEVICE WITH SALICIDE LAYER ISOLATED BY SHALLOW TRENCH ISOLATION FOR SAVING ONE SALICIDE BLOCK PHOTOMASK

CROSS-REFERENCE TO RELATED APPLICATION

This application claims the priority benefit of Taiwan application Serial No. 89123687, filed Nov. 9, 2000.

BACKGROUND OF THE INVENTION

1. Field of the Invention

The invention relates in general to a semiconductor device comprising a salicide layer. More particularly, this invention relates to self-aligned silicide (salicide) layers isolated by a shallow trench isolation for the purpose of saving one salicide block photomask.

2. Description of the Related Art

During or after the fabrication process of an integrated circuit (IC) such as the dynamic random access memory (DRAM) and the static random access memory (SRAM), the electrostatic discharge is a major reason for the damage of the integrated circuit. For example, when one walks on a carpet in the environment with a high relative humidity (RH), hundreds to thousands of electrostatic voltages are carried. When the relative humidity is low, the electrostatic voltage as high as tens of thousands volts can be carried. When these electrostatic charges are in contact with a chip, a discharge is very like to damage the chip to cause the device failure.

FIG. 1 shows an electrostatic discharge (ESD) device structure with a salicide layer isolated by a salicide block. The ESD device structure comprises a P type substrate 10, a drain region 12, a first source region 14, a second source region 16, a first gate 18 and a second gate 20. The drain region 12, the first source region 14, the second source region 16 are formed by doping N+ type ions into the P type substrate 10. The first and second gates 18 and 20 are located between the drain region 12 and the first source region 14, and between the first source region 14 and the second source region 16, respectively. On the surfaces of the drain region 12, the first and second source regions 14 and 16, and the first and second gates 18 and 20, a salicide layer 22 is formed. A metal layer 24 is further formed to connect the drain region 12, the first source region 14 and the second source region 16.

To enhance the capability of the electrostatic discharge, a salicide block 26 is formed surrounding the salicide layer 22 on the drain region 12, so that the salicide layer 22 on the drain region 12 is isolated from the first and second gates 18 and 20. As a result, the effect of the local heating occurring at the drain junction upon the contact metal of the drain region can be eliminated. However, the formation of the salicide block 26 requires an additional photomask, so that the fabrication cost and time are raised.

SUMMARY OF THE INVENTION

The invention provides a electrostatic discharge (ESD) device with a salicide layer isolated by a shallow trench isolation instead of being isolated by the salicide block photomask to eliminate the effect of local heating in the drain junction upon the metal contact.

The ESD device comprises a P type substrate, in which an N well is formed. A gate is formed in the P type substrate out of the N well. A shallow trench isolation is formed in the N well to isolate a portion of the N well. A source region is formed in the P type substrate next to the gate, and a first drain region is formed in the junction of the P type substrate and the N well between shallow trench isolation and the gate. A second drain region is formed in the portion of the N well isolated by the shallow trench isolation. A salicide layer is formed on the gate, the source region, the first drain region and the second drain region, while the salicide layer on the second drain region is isolated from that on the first drain region by the shallow trench isolation.

In another embodiment of the invention, in a P type substrate on which an N well is formed, a P well is further formed in the N well. A gate is formed on the N well out of the P well. A shallow trench isolation is formed in the P well to isolate a central portion of the P well. A source region is formed in the N well and a first drain region is formed in the junction of the P well and the N well between the shallow trench isolation and the gate. A second drain region is formed in the portion of the P well isolated by the shallow trench isolation. A salicide layer is formed on the source region, the gate, the first drain region and the second drain region, while the salicide layer on the second drain region is isolated from that on the second drain region by the shallow trench isolation.

Both the foregoing general description and the following detailed description are exemplary and explanatory only and are not restrictive of the invention, as claimed.

DESCRIPTION OF THE PREFERRED EMBODIMENTS

In the conventional ESD device structure, a salicide layer is isolated by a salicide block to eliminate the effect of local heat generating at the drain region on the drain contact metal. The formation of the salicide block requires an additional photomask, and thus, to cause a raise in fabrication cost and time consumption. The invention provides salicide layer isolated by a shallow trench isolation. As the salicide layer is not formed on the shallow trench isolation, so the additional photomask is not required.

Figure 1:
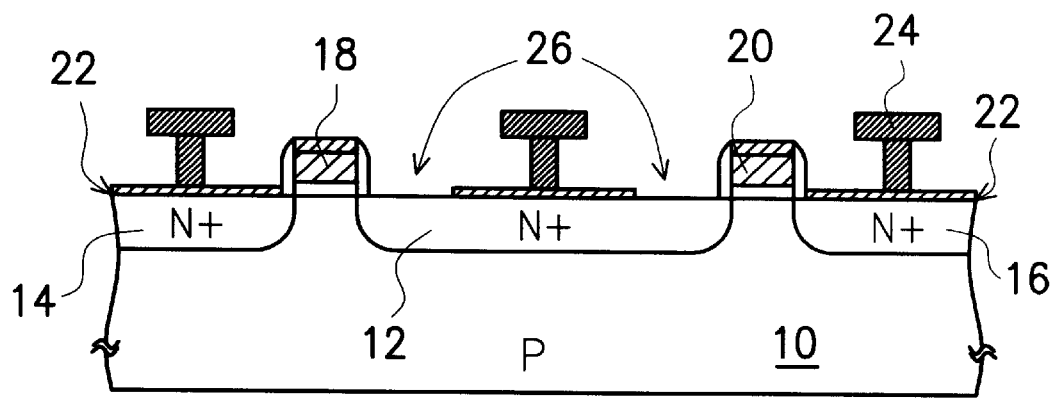
FIG. 1 shows an ESD device structure with a salicide layer isolated by a salicide block.
Figure 2:
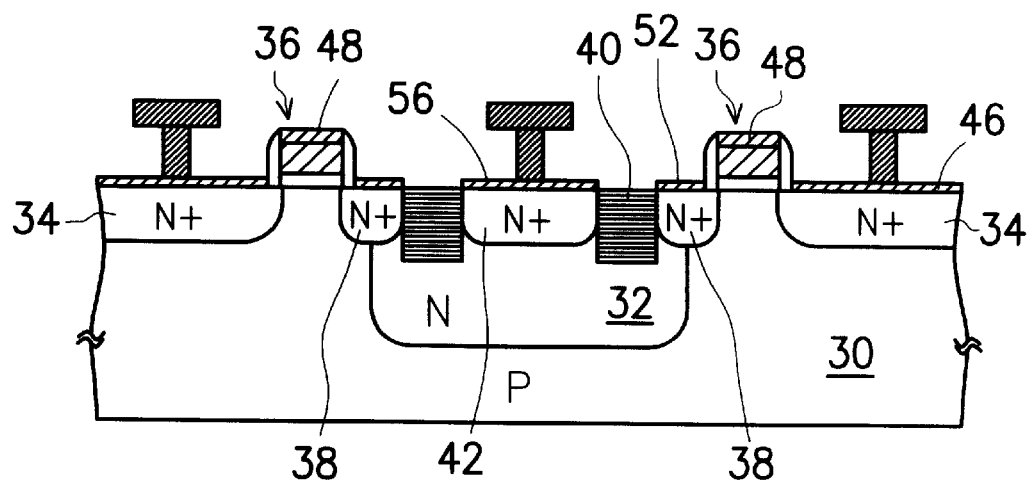
FIG. 2 is an ESD device structure with a salicide layer isolated by a shallow trench isolation according to the invention.

In FIG. 2, the first embodiment of the invention is shown. On a P type substrate 30, an N well 32, source regions 34, gates 36, first drain regions 38, shallow trench isolations 40 and a second drain region 42 are formed.

The N well 32 is formed in the P type substrate 30. In this embodiment, from a cross sectional view as shown in FIG. 2, two gates 36 are formed on the P type substrate 30 at two sides the N well 32. Two shallow trench isolations 40 are formed in the N well 32. N type ions implanted into the P type substrate 30, so as to form the source regions 34, which do not overlap with the N well 32. A salicide layer 46 is also formed on the source region 34. A gate 36 with a salicide layer 48 thereon is formed on the P substrate 30 between the source region 34 and the first drain region 38. The first drain region 38 at side of the gate 36 is formed, for example, by implanting N type ions into the P substrate 30 and the edge portion of the N well 32. The first drain region 38 also extends to the shallow trench isolation 40. The first drain region 38 also has a salicide layer 52 thereon. A second drain region 42 can be formed by implanting N type ions into the N well 32 and is isolated by the shallow trench isolations 40 from the first drain region 38.

By performing a salicidation process, salicide layers 46, 52, 56 and 48 usually are formed on the source regions 34, the first drain regions 38, the second drain region 42, and the gates 36, respectively. However, as well known in the prior art, the salicide layer is not formed on a surface of the shallow trench isolation 40, which includes isolation material. As a result, the salicide layer 56 on the second drain region 42 is isolated from the salicide layers 52 on the first drain regions 38 without using additional photomask.

In the foregoing, the invention particularly uses the shallow trench isolation to isolate the first drain region 38 and the second drain region 42.

Figure 3:
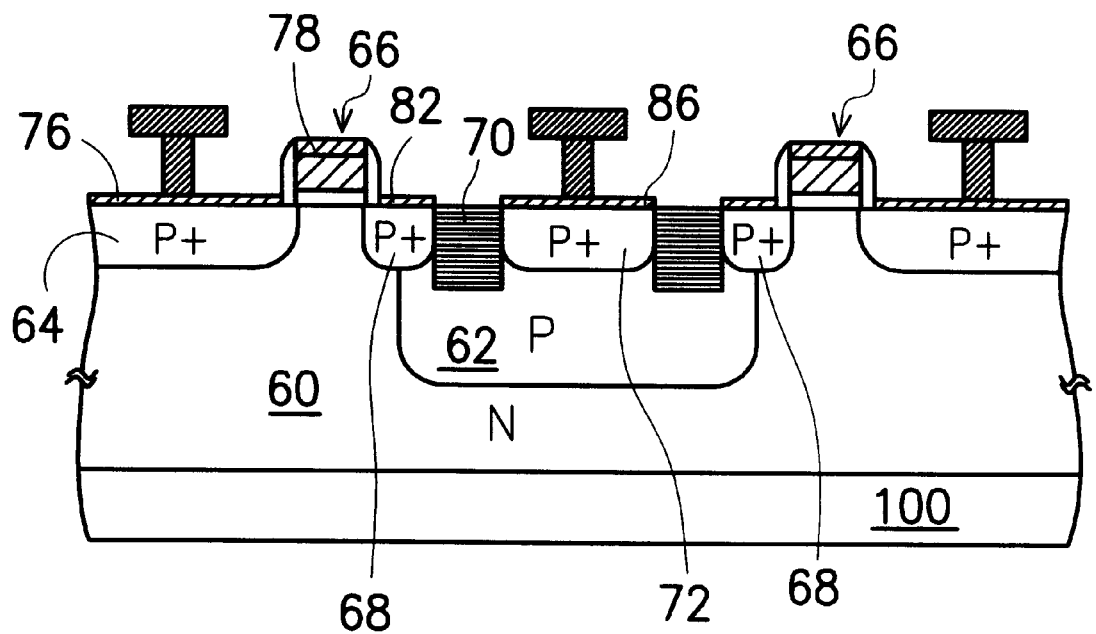
FIG. 3 shows another embodiment of the salicide layer isolated by a shallow trench isolation according to the invention.

FIG. 3 shows another embodiment of the invention. In FIG. 3, a cross sectional view of a device structure having a salicide layer isolated by a shallow trench isolation is illustrated. The device structure comprises an N well 60, a P well 62, a source region 64, a gate 66, a first drain region 66, a shallow trench isolation 40, and a second drain region.

The N well 60 is formed in a P type substrate 100. In the N well 60, a P well 62 is formed. A gate 66 is formed on the N well 60 other than the P well 62. A shallow trench isolation 70 is formed in the P well 62 to isolate the first drain region 68 and the second drain region 72. The source region 64 is formed by implanting N ions into the N well 60. The gate 66 is located between the source region 74 and the first drain region 68. The first drain region 68 is formed in the N well 60 beside the gate 66, extending to the shallow trench isolation 70. In addition, a second drain region 72 is formed in the P well 62 and is isolated from the first drain region 68 by the shallow trench isolation 70.

By performing a salicidation process, a salicide layer is formed on a surface composed of silicon. The second drain region 72 also has a Salicide layer 82 thereon. That is, salicide layers 76, 82, 86 and 78 are formed on the source regions 64, the first drain regions 68, the second drain region 72 and the gates 66, respectively. As well known, isolation material is free from forming the salicide layer thereon. Consequently, the salicide layer is not formed on the shallow trench isolation 70 without using additional photomask. The second drain region 72 usually can be formed by implanting P type ions in to the P well 62.

In the foregoing, the invention particularly uses the shallow trench isolation 70 to isolate the first drain region 68 and the second drain region 72 without using additional photolithography process, the fabrication coast can be effectively reduced. In this manner, the thermal effect due to the local heat of the drain region is effectively reduced. The electric contact on the drain region can remain in an accepted level.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A electrostatic discharge (ESD) device with a salicide layer isolated by a shallow trench isolation, comprising:
   a P type substrate;
   an N well, formed in the P type substrate;
   a shallow trench isolation, formed in the N well;
   a gate structure, on the P type substrate other than the N well, wherein the gate structure has a first side and a second side, and the first side is near to N well;
   a source region, formed in the P type substrate at the second side of the gate structure;
   a first drain region at the first side of the gate structure, formed in the P type substrate and crossing an edge of the N well;
   a second drain region, formed in the N well, wherein the second drain region is isolated from the first drain region by the shallow trench isolation; and
   a salicide layer, formed on the gate, the source region, the first and the second drain regions.

2. The ESD device according to claim 1, wherein the salicide layer on the second drain region is isolated from the salicide layer on the first drain region by the shallow trench isolation.

3. An electrostatic discharge (ESD) device with a salicide layer isolated by a shallow trench isolation, comprising:
   a P type substrate;
   an N well, formed in the substrate;
   a P well, formed in the N well;
   a shallow trench isolation, formed in the P well;
   a gate structure, formed on the N well other than the P well, wherein the gate structure has a first side and a second side, and the first side is near to P well;
   a source region, formed in the N well at the second side of the gate structure;
   a first drain region, at the first side of the gate structure, formed in the N well and crossing an edge of the P well;
   a second drain region, formed in the P well, wherein the second drain region is isolated from the first drain region by the shallow trench isolation; and
   a salicide layer, formed on the source region, the first and second drain region, and gate.

4. The ESD device according to claim 3, wherein the salicide layer on the second drain region is isolated from the salicide layer on the first drain region by the shallow trench isolation.

5. A salicide layer isolated by a shallow trench isolation, comprising:
   a drain region, disposed in a N-well region;
   a shallow trench isolation, partitioning the drain region into two parts, wherein the part of the drain region at a first side of a gate structure, crosses an edge of the N well region; and
   a salicide layer, formed on the two parts of the drain region.

* * * * *